(12) United States Patent
Ono et al.

(10) Patent No.: US 11,551,973 B2
(45) Date of Patent: Jan. 10, 2023

(54) SEMICONDUCTOR DEVICE MANUFACTURING METHOD AND SEMICONDUCTOR DEVICE

(71) Applicant: KIOXIA CORPORATION, Tokyo (JP)

(72) Inventors: Takanobu Ono, Kuwana Mie (JP); Keisuke Tokubuchi, Yokkaichi Mie (JP); Akira Tomono, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/189,117

(22) Filed: Mar. 1, 2021

(65) Prior Publication Data

US 2022/0059407 A1 Feb. 24, 2022

(30) Foreign Application Priority Data

Aug. 19, 2020 (JP) .............................. JP2020-138825

(51) Int. Cl.
*H01L 21/78* (2006.01)
*H01L 23/00* (2006.01)
*H01L 25/18* (2006.01)
*H01L 23/538* (2006.01)

(52) U.S. Cl.
CPC .......... *H01L 21/78* (2013.01); *H01L 23/5383* (2013.01); *H01L 24/11* (2013.01); *H01L 24/13* (2013.01); *H01L 24/94* (2013.01); *H01L 25/18* (2013.01); *H01L 2224/11552* (2013.01); *H01L 2224/1357* (2013.01); *H01L 2224/1369* (2013.01); *H01L 2224/13551* (2013.01); *H01L 2924/1431* (2013.01); *H01L 2924/1438* (2013.01)

(58) Field of Classification Search
CPC ....................................................... H01L 21/78
See application file for complete search history.

(56) References Cited

U.S. PATENT DOCUMENTS

| | | | |
|---|---|---|---|
| 7,301,222 B1 * | 11/2007 | Patwardhan .......... | H01L 21/561 257/622 |
| 10,622,404 B2 | 4/2020 | Yamaguchi et al. | |
| 10,636,707 B2 | 4/2020 | Utsunomiya | |
| 2012/0074565 A1 | 3/2012 | Koroku | |
| 2014/0242756 A1 * | 8/2014 | Xue ........................ | H01L 21/78 438/113 |

FOREIGN PATENT DOCUMENTS

| | | | |
|---|---|---|---|
| JP | 2010-239005 A | 10/2010 | |
| WO | 2017-077957 A1 | 8/2018 | |
| WO | 2017-077958 A1 | 8/2018 | |

* cited by examiner

*Primary Examiner* — William A Harriston
(74) *Attorney, Agent, or Firm* — Kim & Stewart LLP

(57) ABSTRACT

A method for manufacturing a semiconductor device includes providing an adhesive film over a first surface of a semiconductor wafer on which a semiconductor device layer and a bump electrically connected to the semiconductor device layer are formed, forming a slit in the adhesive film, fragmenting the semiconductor wafer into semiconductor chips along the slit, and connecting the bump to a wiring of a circuit board within the adhesive film.

20 Claims, 10 Drawing Sheets

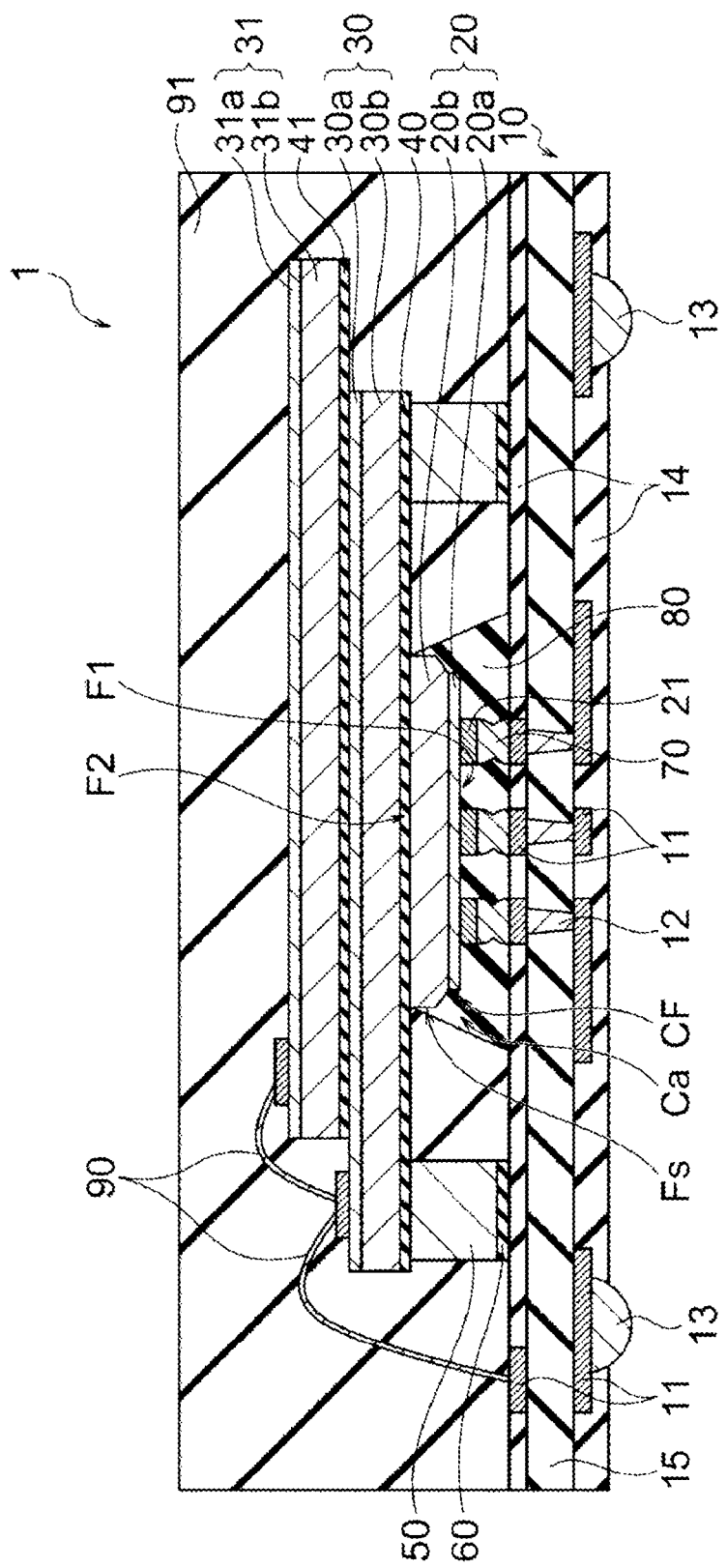

SEMICONDUCTOR DEVICE MANUFACTURING METHOD AND SEMICONDUCTOR DEVICE

CROSS-REFERENCE TO RELATED APPLICATION(S)

This application is based upon and claims the benefit of priority from Japanese Patent Application No. 2020-138825, filed Aug. 19, 2020, the entire contents of which are incorporated herein by reference.

FIELD

Embodiments described herein relate generally to a semiconductor device manufacturing method and a semiconductor device.

BACKGROUND

Flip chip bonding is a method for mounting a semiconductor chip on a circuit board. In flip chip bonding, a space between the semiconductor chip and the circuit board is filled with resin in order to secure reliability at the bonded part. For example, an adhesive film, such as a non-conductive film (NCF), may be used as the filling resin. In one example, dicing a semiconductor wafer that is attached with an NCF yields fragmented semiconductor chips, each with the NCF thereon. Alternatively, fragmented semiconductor chips, each with the NCF, can be obtained also by cutting an NCF that is attached on the diced semiconductor wafer.

However, dividing failure of an NCF, such that, for example, the NCF is not completely divided as intended by dicing or cutting, or that the NCF is divided in a meandering manner, may occur on the semiconductor wafer.

BRIEF DESCRIPTION OF THE DRAWINGS

FIG. 7 is a cross-sectional view showing a structure of a semiconductor device according to a fifth embodiment.

DETAILED DESCRIPTION

Embodiments provide semiconductor device manufacturing methods that enable more appropriately dividing an adhesive film on a semiconductor wafer and semiconductor devices manufactured thereby.

In general, according to one embodiment, method for manufacturing a semiconductor device includes providing an adhesive film over a first surface of a semiconductor wafer on which a semiconductor device layer and a bump electrically connected to the semiconductor device layer are formed, forming a slit in the adhesive film, fragmenting the semiconductor wafer into semiconductor chips along the slit, and connecting the bump to a wiring of a circuit board within the adhesive film.

Hereinafter, certain embodiments according to the present disclosure will be described with reference to the drawings. These example embodiments are not intended to limit the present disclosure. In the following embodiments, described upper and lower directions are generally based on distance to a circuit board or device substrate and are relative direction descriptions such that when a surface on which a semiconductor chip is arranged is considered an upper surface, and the lower direction is not necessarily the direction of gravitational acceleration. The drawings show schematic or conceptual examples, which may differ from actual products or components in such things as dimensional ratios of parts, and so on. In the specification and drawings, elements that are similar to those described in relation to drawings already explained, are given the same reference signs, and detailed descriptions thereof are appropriately omitted.

First Embodiment

Figure 1:
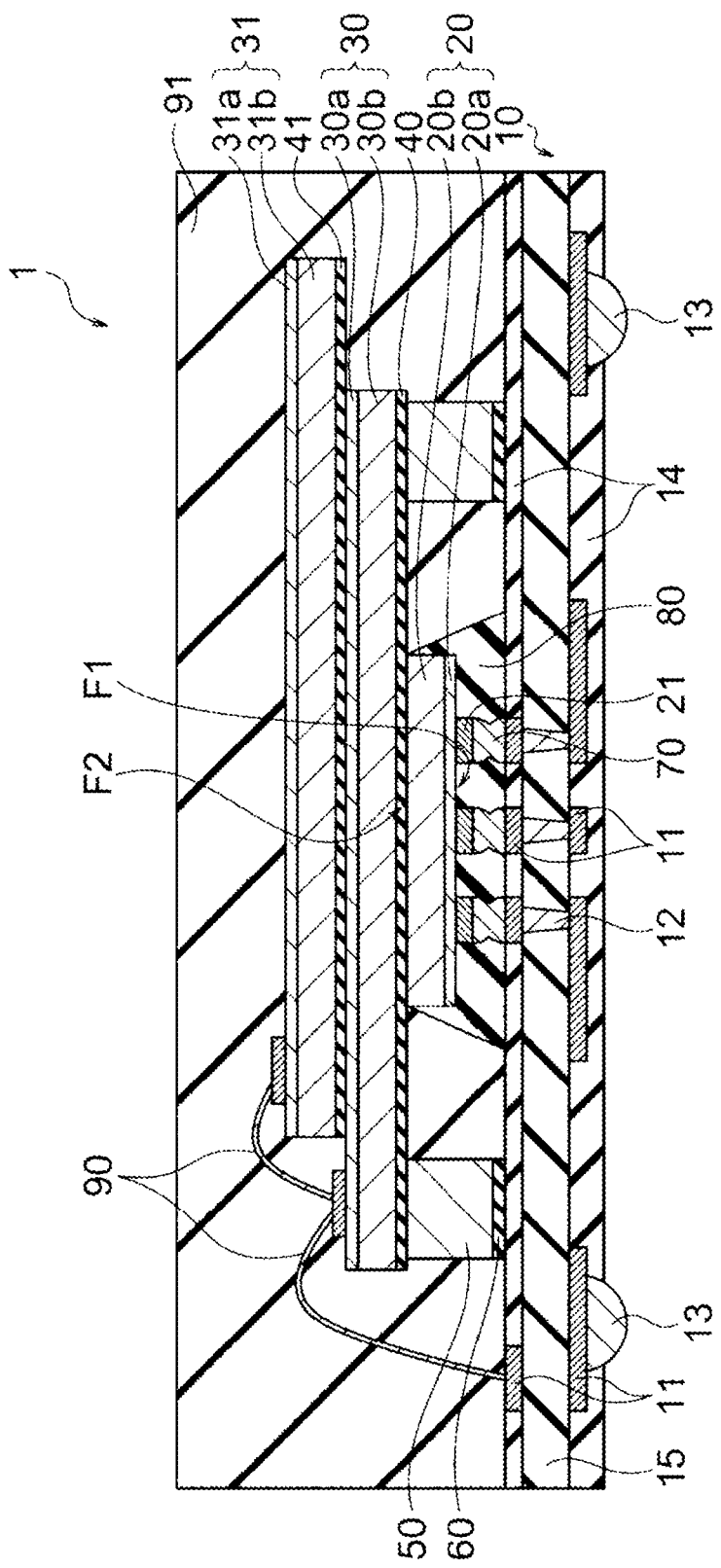
FIG. 1 is a cross-sectional view showing a structure of a semiconductor device according to a first embodiment.

FIG. 1 is a cross-sectional view showing a structure of a semiconductor device 1 according to a first embodiment. The semiconductor device 1 includes a circuit board 10, semiconductor chips 20, 30, and 31, adhesive layers 40 and 41, a spacer chip 50, an adhesive layer 60, a metal material 70, an adhesive film or adhesive layer 80, a bonding wire 90, and a sealing resin 91. The semiconductor device 1 is, for example, a NAND flash memory package.

The circuit board 10 is, for example, a printed board or interposer including a wiring layer 11 and an insulating layer 15. The wiring layer 11 includes, for example, a low-resistance metal, such as copper, nickel, or alloy thereof. The insulating layer 15 includes, for example, an insulating material, such as glass epoxy resin. In the drawings, the wiring layer 11 is provided on only upper and lower surfaces of the insulating layer 15. However, the circuit board 10 may have a multi-layered wiring structure including multiple wiring layers 11 and multiple insulating layers 15. The circuit board 10 may have, for example, a through via 12 that penetrates the upper and back surfaces thereof, like an interposer.

The upper surface of the circuit board 10 includes a solder resist layer 14 on the wiring layer 11. The solder resist layer 14 is an insulating layer for protecting the wiring layer 11 from the metal material 70 so as to prevent short circuit failure. The solder resist layer 14 has an opening (not shown), from which a part of the wiring layer 11 and the insulating layer 15 are exposed.

The back surface of the circuit board 10 also includes a solder resist layer 14 on the wiring layer 11. A metal bump 13 is formed on the wiring layer 11 that is exposed from the solder resist layer 14. The metal bump 13 is provided in order to electrically connect the circuit board 10 to other components (not shown).

The semiconductor chip 20 is, for example, a controller chip for controlling a memory chip. A semiconductor device layer 20a is provided at a lower part of the semiconductor chip 20. The semiconductor device layer 20a includes, for example, a complementary metal oxide semiconductor (CMOS) circuit, which operates as a controller. An electrode pillar 21 is provided below the semiconductor chip 20. The electrode pillar 21 is electrically connected to the semiconductor device layer 20a. The electrode pillar 21 includes, for example, a low-resistance metal, such as copper, nickel, or alloy thereof.

In more detail, the semiconductor chip 20 has a surface F1 and a surface F2 that is on a side opposite to the surface F1, and the semiconductor chip 20 has the semiconductor device layer 20a and the electrode pillar 21, which is electrically connected to the semiconductor device layer 20a, on the surface F1. The semiconductor chip 20 is coupled to the circuit board 10 via the electrode pillar 21, on the surface F1 side. The semiconductor chip 20 includes the semiconductor device layer 20a and a semiconductor substrate 20b. The semiconductor substrate 20b is, for example, a silicon substrate. The material of the semiconductor is not limited to silicon and may be another material.

The metal material 70 is provided around the electrode pillar 21 that functions as a bump. The electrode pillar 21 is electrically connected to the wiring layer 11 via the metal material 70. The metal material 70 includes, for example, a low-resistance metal material, such as solder, silver, or copper.

The adhesive film 80 is a resin layer or an underfill and is provided around the semiconductor chip 20 and between the semiconductor chip 20 and the circuit board 10. The adhesive film 80 is, for example, a cured adhesive film, such as of a non-conductive film (NCF), and the adhesive film 80 covers to protect around the semiconductor chip 20. The adhesive film 80 is not limited to an NCF and may be any adhesive film that contains thermosetting resin.

In more detail, the adhesive film 80 covers the electrode pillar 21 and the metal material 70 between the semiconductor chip 20 and the circuit board 10.

The semiconductor chip 30 is attached on the semiconductor chip 20 via the adhesive layer 40. The semiconductor chip 30 is, for example, a memory chip including a NAND flash memory. The semiconductor chip 30 includes a semiconductor device layer 30a. The semiconductor device layer 30a includes, for example, a memory cell array and a peripheral circuit or CMOS circuit. The memory cell array may be a three-dimensional memory cell array in which multiple memory cells are three-dimensionally arranged. Moreover, the semiconductor chip 31 is attached on the semiconductor chip 30 via the adhesive layer 41. The semiconductor chip 31 is, for example, a memory chip including a NAND flash memory, as in the case of the semiconductor chip 30. The semiconductor chips 30 and 31 may be memory chips of the same type. In the drawings, in addition to the semiconductor chip 20 being the controller chip, the semiconductor chips 30 and 31 are stacked as two memory chips. However, the number of the stacked semiconductor chips may be one, or three or more.

In more detail, the semiconductor chip 30 includes the semiconductor device layer 30a and a semiconductor substrate 30b, and the semiconductor chip 31 includes a semiconductor device layer 31a and a semiconductor substrate 31b. The semiconductor substrates 30b and 31b are, for example, silicon substrates. The material of the semiconductor is not limited to silicon and may be another material.

The spacer chip 50 is provided between the semiconductor chip 30 and the solder resist layer 14 of the circuit board 10, around the semiconductor chip 20. The spacer chip 50 is attached on the solder resist layer 14 via the adhesive layer 60. The adhesive layer 40 is attached on an upper surface of the spacer chip 50, and the semiconductor chip 30 is attached on the upper surface of the spacer chip 50 via the adhesive layer 40.

The bonding wire 90 is coupled to a pad of the circuit board 10 or the semiconductor chip 30 or 31. The semiconductor chips 30 and 31 are stacked in a manner mutually displaced by the length of the pad, so as to be coupled by the bonding wire 90. On the other hand, the semiconductor chip 20 is flip-chip bonded by the electrode pillar 21 and is therefore not wire-bonded. However, the semiconductor chip 20 may also be wire-bonded in addition to the bonding with the electrode pillar 21.

Furthermore, the sealing resin 91 seals the semiconductor chips 20, 30, and 31, the spacer chip 50, the adhesive film 80, the bonding wire 90, and so on. Thus, the semiconductor device 1 is formed as one semiconductor package including the multiple semiconductor chips 20, 30, and 31 disposed on the circuit board 10.

Next, a method for manufacturing the semiconductor device 1 will be described.

Figure 2:
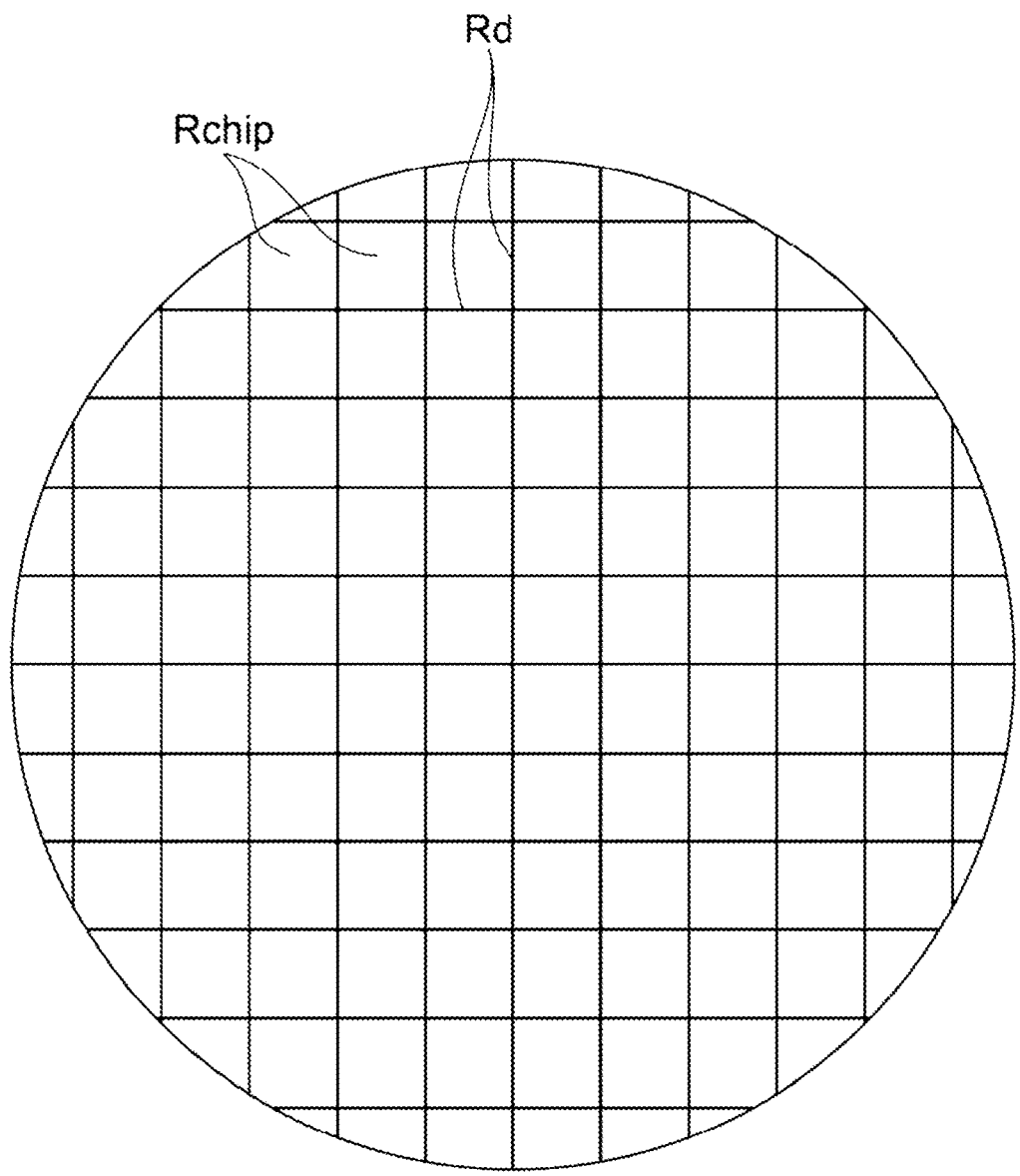
FIG. 2 is a schematic plan view showing a semiconductor wafer according to a first embodiment.

FIG. 2 is a schematic plane view showing a semiconductor wafer W. The semiconductor wafer W includes multiple chip regions Rchip and multiple dicing regions Rd. The chip region Rchip and the dicing region Rd are regions on a surface of the semiconductor wafer W.

The chip region Rchip is a semiconductor chip region including semiconductor elements, such as a transistor and a memory cell array. For example, the semiconductor device layers 20a, 30a, and 31a shown in FIG. 1 are provided in the chip region Rchip.

The dicing region Rd is a dividing region having a line shape between adjacent chip regions Rchip and to be cut in dicing. The dicing region Rd is also called a "dicing line". Dicing the semiconductor wafer W along the dicing region Rd fragments the semiconductor wafer W with respect to each chip region Rchip, into semiconductor chips.

FIGS. 3A to 3G are cross-sectional views showing a method for manufacturing the semiconductor device 1. FIGS. 3A to 3G also show a cross section of the semiconductor wafer W in FIG. 2. The reference sign "Wa" represents a semiconductor device layer of the semiconductor wafer W before the semiconductor wafer W is fragmented into different die or the like. The reference sign "Wb" similarly represents a semiconductor substrate in the semiconductor wafer W before the semiconductor wafer W is fragmented.

Figure 3A:
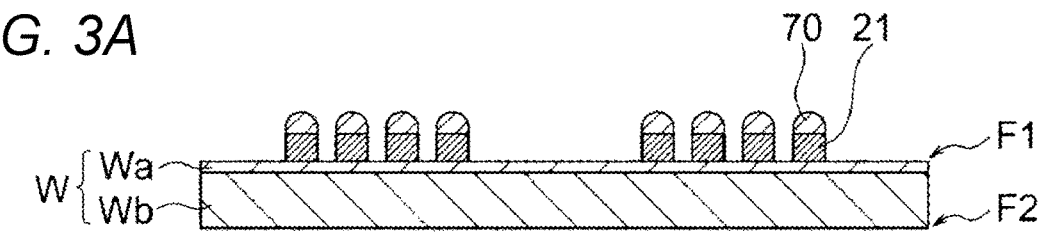
FIGS. 3A-3G are a cross-sectional views depicting aspects of a method for manufacturing a semiconductor device according to a first embodiment.

First, as shown in FIG. 3A, a semiconductor device layer Wa and an electrode pillar 21 are formed on a surface F1 of a semiconductor wafer W. That is, the semiconductor wafer W has the surface F1 and a surface F2 that is on a side opposite to the surface F1, and the semiconductor wafer W has the semiconductor device layer Wa and the electrode pillar 21, which is electrically connected to the semiconductor device layer Wa, on the surface F1. The thickness of the semiconductor wafer W is, for example, approximately 30 μm. The height of the electrode pillar 21 is, for example, approximately 60 μm. The height of the metal material 70 is, for example, approximately 60 μm.

Figure 3B:

Next, as shown in FIG. 3B, a protective tape PT is attached on the surface F1 of the semiconductor wafer W.

Figure 3C:
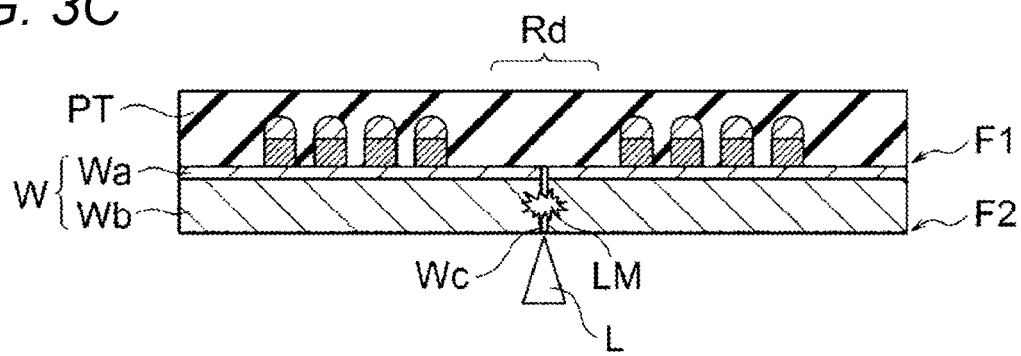

Then, as shown in FIG. 3C, an internally focused laser-based fragmentation process, such as Stealth Dicing™, is performed. That is, prior to providing an adhesive film 80 on the semiconductor wafer W, laser light L is emitted from the surface F2 side of the semiconductor wafer W, whereby a modified part or modified layer LM is formed in the semiconductor wafer W along a dicing region Rd. The modified part LM is formed, for example, in the semiconductor substrate Wb. In addition, a crack Wc extends from the modified part LM in a direction perpendicular to the surfaces F1 and F2. The crack Wc may be extended by back surface grinding that is performed subsequently.

Figure 3D:
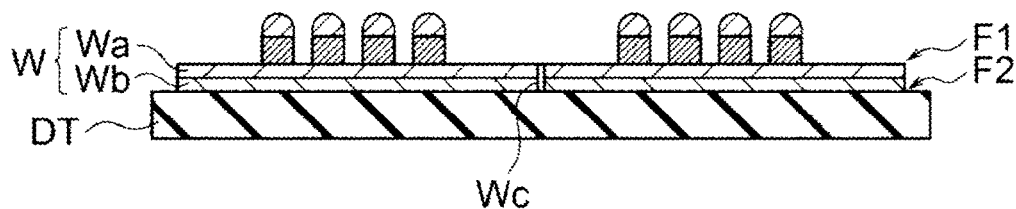

Thereafter, as shown in FIG. 3D, the back surface of the semiconductor wafer W is ground, and this semiconductor wafer W is mounted on a dicing tape DT. The back surface grinding is performed by, for example, a chemical mechanical polishing (CMP) method. The surface F2 of the semiconductor wafer W is polished, for example, until the modified part LM is removed.

Figure 3E:
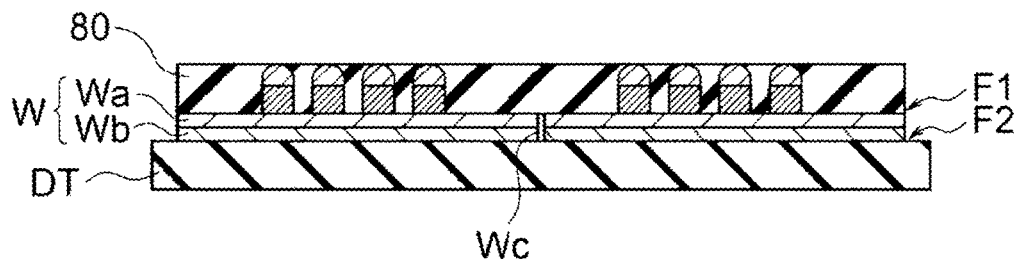

Next, as shown in FIG. 3E, an adhesive film 80 is attached on the surface F1 of the semiconductor wafer W. That is, the adhesive film 80 is provided so as to cover the surface F1 of the semiconductor wafer W. The thickness of the adhesive film 80 is, for example, from approximately 30 to 60 μm.

Figure 3F:
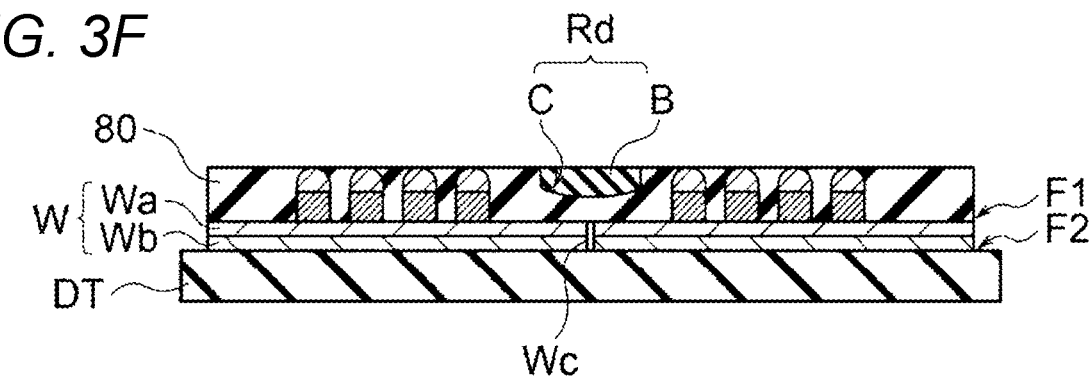

Then, as shown in FIG. 3F, a slit or groove C is formed from the adhesive film 80 side, along the dicing region Rd of the semiconductor wafer W. In more detail, the slit C is formed from the adhesive film 80 side, along the dicing region Rd of the semiconductor wafer W, in such a manner as to be shallower than the surface F1 of the semiconductor wafer W or the thickness of the adhesive film 80. That is, the slit C does not reach the semiconductor wafer W. Cutting a part of the adhesive film 80 in the dicing region Rd facilitates dividing the adhesive film 80 in the subsequent step. This results in more appropriately dividing the adhesive film 80 that is provided on the semiconductor chip 20. The depth of the slit C is, for example, approximately one-third or more of the thickness of the adhesive film 80. The slit C is formed by a blade B.

Figure 3G:
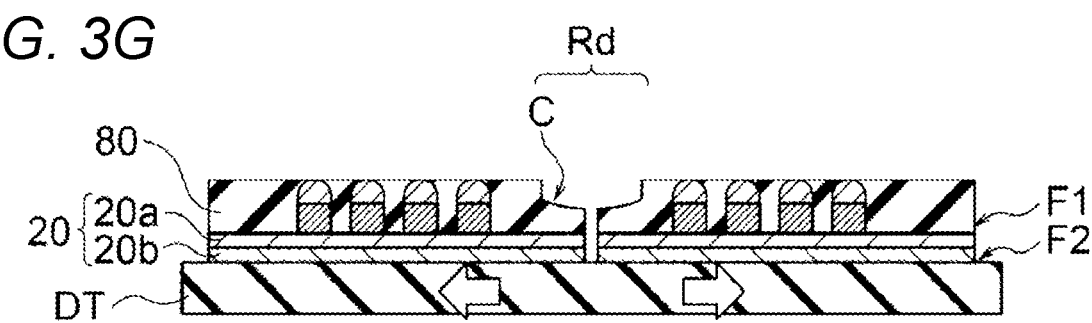

Thereafter, as shown in FIG. 3G, the semiconductor wafer W is fragmented into semiconductor chips 20 along the slit C. In more detail, the semiconductor wafer W is cleaved, starting from the modified part LM, whereby it is fragmented into semiconductor chips 20 along the slit C. In further detail, the dicing tape DT has an adhesive layer adhering on the surface F2 of the semiconductor wafer W, and the dicing tape DT is pressed upwardly from a lower side in FIG. 3G by a pressing member (not shown), to be pulled or expanded. Each semiconductor chip 20 is separated along the crack Wc in the dicing region Rd in such a manner as to be cleaved, whereby the semiconductor wafer W is fragmented into semiconductor chips 20.

Meanwhile, in more detail, the semiconductor wafer W is fragmented into semiconductor chips 20 while the adhesive film 80 is divided along the slit C. That is, expanding the dicing tape DT divides the adhesive film 80 approximately at the same time of fragmentation into semiconductor chips 20. The adhesive film 80 is partially cut by the slit C, as described above, and therefore, the adhesive film 80 is more easily divided.

Thereafter, the semiconductor chip 20 is mounted on a circuit board 10. That is, the surface F1 of the semiconductor chip 20 is made to face the circuit board 10, and the electrode pillar 21 is coupled to the circuit board 10, within the adhesive film 80. The adhesive film 80 is subjected to a curing process. Moreover, a spacer chip 50 is mounted on the circuit board 10, and semiconductor chips 30 and 31 are mounted on the spacer chip 50 and the semiconductor chip 20. Furthermore, a bonding wire 90 is bonded to each of the semiconductor chips 30 and 31. This completes the semiconductor device 1 shown in FIG. 1.

As described above, the slit C is formed from the adhesive film 80 side along the dicing region Rd of the semiconductor wafer W. The semiconductor wafer W is fragmented into semiconductor chips 20 along the slit C. Thus, the slit C for facilitating dividing the adhesive film 80 is formed in the adhesive film 80 prior to fragmentation into semiconductor chips 20. The slit C is formed in correspondence with the outline of the chip region Rchip, as viewed from above the surface F1 of the semiconductor wafer W. This enables more appropriately dividing the adhesive film 80 that is attached on the semiconductor wafer W, in fragmenting into semiconductor chips 20.

Not providing the slit C to the adhesive film 80 may cause the adhesive film 80 to be not divided in the step in FIG. 3G. In such a case, the semiconductor chip 20 may be discarded due to failure of the adhesive film 80.

On the other hand, in the first embodiment, the slit C is provided in the adhesive film 80, whereby it is possible to prevent the adhesive film 80 from being not divided and to prevent occurrence of failure.

In the above-described embodiments, fragmentation into semiconductor chips 20 is performed by a stealth dicing process. In such a case, after the modified part LM is formed, but before the adhesive film 80 is provided, the condition of the crack Wc extending from the modified part LM to the surface F1 or F2 of the semiconductor wafer W, may be inspected. Thus, dicing inspection may be performed after the step in FIG. 3C but before the step in FIG. 3E. The dicing inspection is performed to inspect the cut condition of the diced semiconductor wafer W. When a stealth dicing process is performed, the dicing inspection is performed to check, for example, presence, generated position, straightness, and occurrence of tearing off, with respect to the crack Wc.

When another dicing, such as blade dicing, laser ablation, or plasma dicing, is performed, fragmentation into semiconductor chips 20 is normally performed after the adhesive film 80 is attached. In one example, blade dicing may mechanically damage the semiconductor chip 20 and may cause chipping. However, the adhesive film 80 is already attached, and thus, the dicing inspection is difficult to perform.

On the other hand, in the first embodiment, a stealth dicing process is performed before the adhesive film 80 is attached, and therefore, the dicing inspection can be performed by checking the crack Wc before the adhesive film 80 is attached. This facilitates securing quality of the semiconductor chip 20.

In the first embodiment, the semiconductor wafer W is separated in a cleaving manner using a stealth dicing process. Thus, the cutting margin (or dicing width) is smaller than that in other dicing techniques such as blade dicing, laser ablation, or plasma dicing, and the cutting margin is approximately zero.

When another dicing method is used, in order to perform the dicing inspection, the adhesive film 80 may be attached on the semiconductor wafer W after fragmentation into semiconductor chips 20 is performed, and, for example, the adhesive film 80 may be divided by expanding the dicing tape DT, as in the case of a stealth dicing process. However, a large cutting margin may cause the adhesive film 80 to be divided in a meandering manner inside the cutting margin. In such a case, the shape and the like of the adhesive film 80 at an outer circumferential part of the semiconductor chip 20 are not constant, whereby dividing failure of the adhesive film 80 occurs.

On the other hand, in the first embodiment, stealth dicing provides a small cutting margin. This prevents the adhesive film 80 from being divided in a meandering manner. Thus, it is possible to prevent occurrence of dividing failure of the adhesive film 80.

In the first embodiment, the slit C, which is formed by the blade B, does not reach the semiconductor wafer W. Thus, the factor that could damage the semiconductor chip 20 is avoided. Stealth dicing process, in general, causes less damage to the semiconductor chip 20 than other dicing techniques and is not prone to cause chipping, this improves flexural strength. In this manner, the adhesive film 80 can be more appropriately divided while damage to the semiconductor chip 20 is prevented.

Second Embodiment

Figure 4:
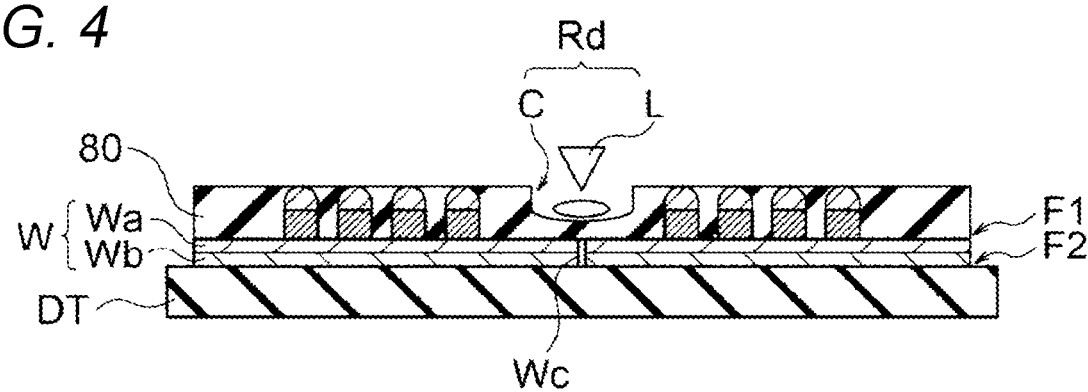
FIG. 4 is a cross-sectional view depicting aspects of a method for manufacturing a semiconductor device according to a second embodiment.

FIG. 4 is a cross-sectional view showing a method for manufacturing the semiconductor device 1 according to a second embodiment. The second embodiment differs from the first embodiment in that a slit C is formed by laser ablation, instead of the blade B. In the second embodiment, fragmentation into semiconductor chips 20 is performed by a so-called stealth dicing process. Thus, the step in FIG. 4 is performed subsequently to steps similar to those in FIGS. 3A to 3E.

After an NCF is attached on the semiconductor wafer W (refer to FIG. 3E), a slit C is formed by laser ablation, as shown in FIG. 4. Laser ablation is a method to melt and evaporate a material surface by irradiating the material surface with laser light having a high photon density. That is, the method for forming the slit C may be any method described herein. The step after the step in FIG. 4 may be similar to that in FIG. 3G.

The other elements of the semiconductor device 1 in the second embodiment are similar to the corresponding elements of the semiconductor device 1 in the first embodiment. The semiconductor device 1 in the second embodiment provides effects similar to those obtained by the semiconductor device 1 in the first embodiment.

Third Embodiment

FIGS. 5A to 5D are cross-sectional views showing a method for manufacturing the semiconductor device 1 according to a third embodiment. The third embodiment differs from the first embodiment in that fragmentation into semiconductor chips 20 is performed by a method other than a stealth dicing process. The steps in FIGS. 5A to 5D are performed subsequently to steps similar to those in FIGS. 3A and 3B.

Figure 5A:
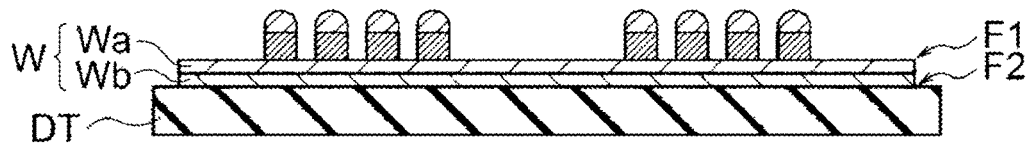
FIGS. 5A-5D are cross-sectional views depicting aspects of a method for manufacturing a semiconductor device according to a third embodiment.

After a protective tape PT is attached on the surface F1 of the semiconductor wafer W (refer to FIG. 3B), the back surface of the semiconductor wafer W is ground, and this semiconductor wafer W is mounted on a dicing tape DT, as shown in FIG. 5A.

Figure 5B:
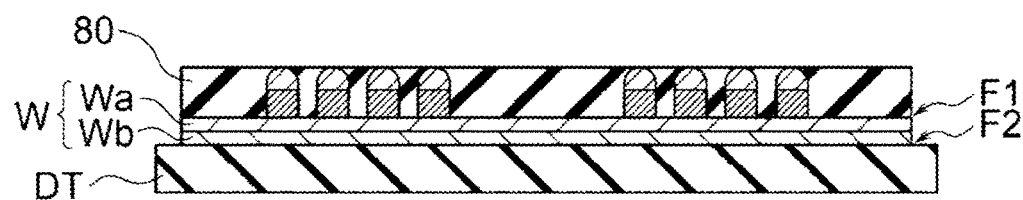

Next, as shown in FIG. 5B, an adhesive film 80 is attached on the surface F1 of the semiconductor wafer W.

Figure 5C:
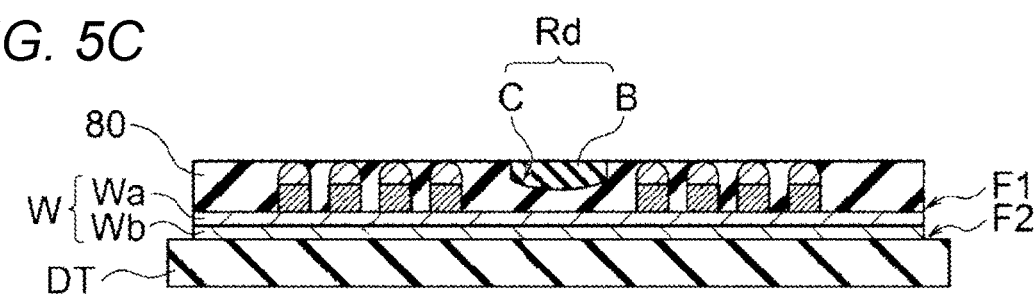

Then, as shown in FIG. 5C, a slit C is formed from the adhesive film 80 side, along the dicing region Rd of the semiconductor wafer W. In more detail, the slit C is formed by the blade B.

The steps in FIGS. 5A to 5C may be similar to those in FIGS. 3D to 3F.

Figure 5D:
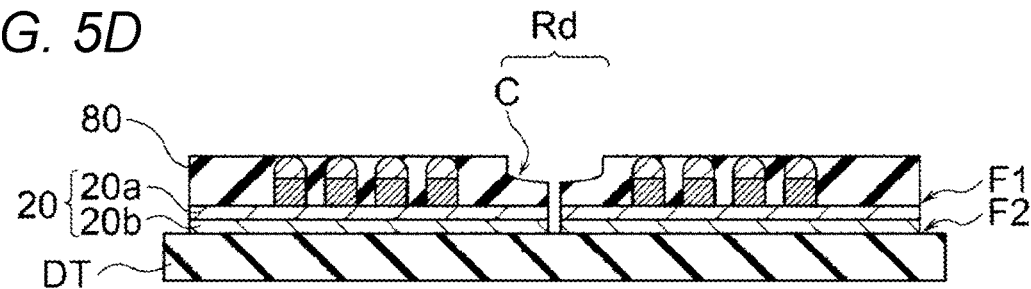

Thereafter, as shown in FIG. 5D, the semiconductor wafer W is fragmented into semiconductor chips 20 along the slit C. Fragmentation is performed by dicing the semiconductor wafer W using, for example, blade dicing, laser ablation, or plasma dicing. That is, the fragmentation method may be any method described herein.

The other elements of the semiconductor device 1 in the third embodiment are similar to the corresponding elements of the semiconductor device 1 in the first embodiment. The semiconductor device 1 in the third embodiment provides effects similar to those obtained by the semiconductor device 1 in the first embodiment.

Fourth Embodiment

Figure 6:
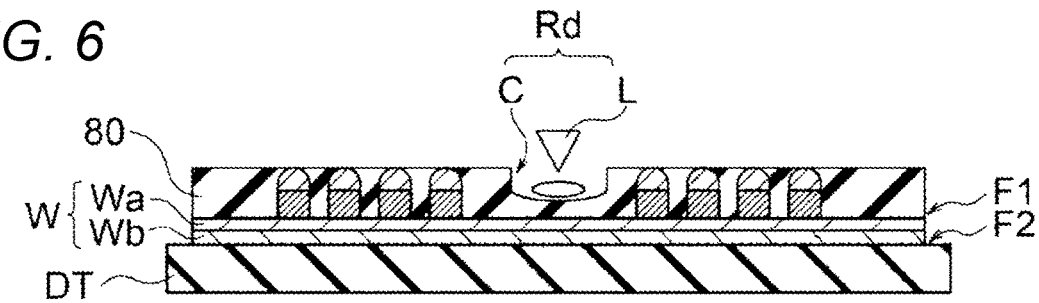
FIG. 6 is a cross-sectional view depicting aspects of a method for manufacturing a semiconductor device according to a fourth embodiment.

FIG. 6 is a cross-sectional view showing a method for manufacturing the semiconductor device 1 according to a fourth embodiment. The fourth embodiment differs from the third embodiment in that a slit C is formed by laser ablation, instead of the blade B. In the fourth embodiment, fragmentation into semiconductor chips 20 is performed by a method other than a stealth dicing process. Thus, the step in FIG. 6 is performed subsequently to steps similar to those in FIGS. 3A and 3B and steps similar to those in FIGS. 5A and 5B. The fourth embodiment is a combination of the second and the third embodiments.

After the adhesive film 80 is attached on the surface F1 of the semiconductor wafer W (refer to FIG. 5B), a slit C is formed from the adhesive film 80 side, along the dicing region Rd of the semiconductor wafer W, as shown in FIG. 6. In more detail, the slit C is formed by laser ablation. That is, the method for forming the slit C may be any method described herein. The step after the step in FIG. 6 may be similar to that in FIG. 5D.

The other elements of the semiconductor device 1 in the fourth embodiment are similar to the corresponding elements of the semiconductor device 1 in the third embodiment. The semiconductor device 1 in the fourth embodiment provides effects similar to those obtained by the semiconductor device 1 in the first embodiment.

Fifth Embodiment

FIG. 7 is a cross-sectional view showing a structure of the semiconductor device 1 according to a fifth embodiment. The fifth embodiment differs from the first embodiment in that a cut part Ca is provided at an outer circumferential part of the surface F1 of the semiconductor chip 20.

The semiconductor chip 20 includes a cut part Ca that is provided at a corner of the outer circumferential part of the surface F1, at which a side surface Fs between the surfaces F1 and F2 of the semiconductor chip 20 and the surface F1 crosses each other. That is, the semiconductor device layer 20a, which is provided on the surface F1 side, is cut at the corner, whereby the area of the surface F1 is smaller than the area of the surface F2.

The cut part Ca reduces effects of stress, or more specifically, packaging stress due to mounting.

As shown in FIG. 1, when no cut part Ca is provided, an outer circumferential end of the semiconductor device layer 20a is positioned at an end surface of the semiconductor chip 20. The semiconductor device layer 20a is generally a multilayer film. Thus, for example, damage, such as peeling off of the film, or crack, may occur at an outer circumferential end surface or the outer circumferential part of the semiconductor device layer 20a in dicing or another step. Such damage may advance to the inside or the center part due to, for example, packaging stress due to mounting. Moreover, in general, the vicinity of the outer circumferential end surface of the semiconductor chip 20 is a region where packaging stress is great in the semiconductor chip 20. Thus, damage at the outer circumferential end surface of the semiconductor device layer 20a tends to advance to the inside.

On the other hand, in the fifth embodiment, the outer circumferential part of the semiconductor device layer 20a is separated from the outer circumferential end surface toward the center of the semiconductor chip 20. This structure reduces packaging stress due to mounting. Thus, it is possible to prevent advancing to the inside of damage that occurs in the semiconductor device layer 20a at the time of fragmentation, such as dicing.

The adhesive film 80 is in contact with a cut part surface CF of the cut part Ca. That is, as shown in FIG. 7, the adhesive film 80 fills the space around the cut part Ca. This allows a part of the adhesive film 80 to move to the cut part Ca at the time of flip chip bonding, whereby it is possible to prevent the adhesive film 80 from excessively spreading on the circuit board 10. In one example, when the adhesive film 80 comes into contact with a bonding pad on the circuit board 10, it is difficult to couple the bonding wire 90 to the bonding pad.

In more detail, the cut part surface CF of the cut part Ca has a shape or a surface state different from that of the side surface Fs. The surface state includes, for example, surface roughness. That is, the cut part surface CF and the side surface Fs have cut surfaces different from each other. This is because the cut part surface CF and the side surface Fs are cut by cutting methods different from each other, as described later.

Next, a method for manufacturing this semiconductor device 1 will be described.

Figure 8A:
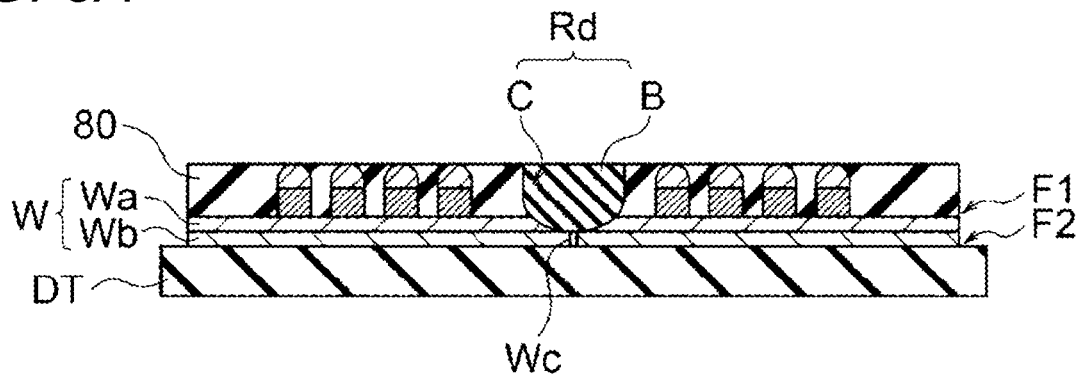
FIGS. 8A and 8B are cross-sectional views depicting aspects of a method for manufacturing a semiconductor device according to a fifth embodiment.
Figure 8B:
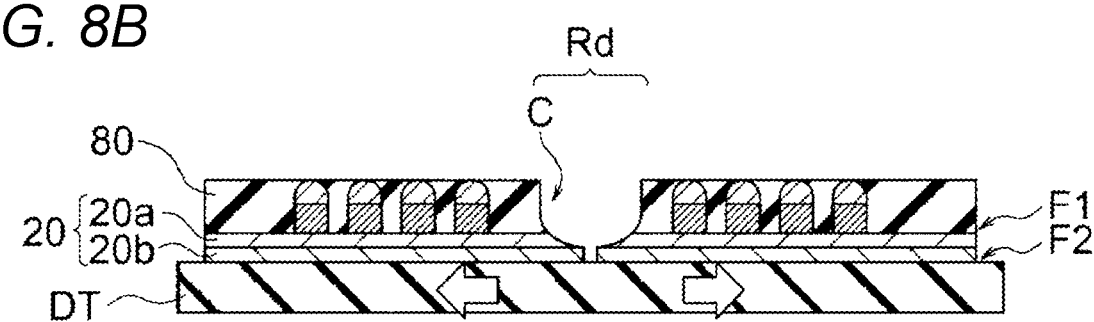

FIGS. 8A and 8B are cross-sectional views showing the method for manufacturing the semiconductor device 1 according to the fifth embodiment. In the fifth embodiment, fragmentation into semiconductor chips 20 is performed by a stealth dicing process or the like. Thus, the steps in FIGS. 8A and 8B are performed subsequently to steps similar to those in FIGS. 3A to 3E in the first embodiment.

After an adhesive film 80 is attached on the surface F1 of the semiconductor wafer W (refer to FIG. 3E), a slit C for cutting the adhesive film 80 and the semiconductor device layer 20a is formed, as shown in FIG. 8A. In more detail, the slit C is formed from the adhesive film 80 side, along the dicing region Rd, in such a manner as to be deeper than the semiconductor device layer Wa but be shallower than the surface F2 of the semiconductor wafer W. That is, the slit C reaches the semiconductor wafer W to cut the adhesive film 80 and the semiconductor device layer Wa but does not completely cut the semiconductor wafer W or the semiconductor substrate Wb. Thus, the adhesive film 80 is more reliably divided. Moreover, a cut part Ca is formed in the semiconductor chip 20 shown in FIG. 7. The cut part Ca has a width approximately half of the width of the blade B shown in FIG. 8A or of the dicing width.

Thereafter, as shown in FIG. 8B, the semiconductor wafer W is fragmented into semiconductor chips 20 along the slit C. The adhesive film 80 and the semiconductor device layer Wa are already cut in the step in FIG. 8A, and thus, the semiconductor substrate Wb is cut in the step in FIG. 8B.

In more detail, the semiconductor wafer W is fragmented into semiconductor chips 20 along the slit C by dicing the semiconductor wafer W so that the cut surface will have a shape or a surface state different from that of the cross section of the slit C. The cross section of the slit C has a rough surface due to mechanical cutting with the blade B. On the other hand, the cut surface of the semiconductor substrate Wb is a cleavage surface of, for example, a silicon substrate, and therefore, this cut surface is a crystal face of silicon single crystal. Thus, the cut surface of the semiconductor substrate Wb is a smooth surface in a mirror state with a relatively small amount of crystal defects and with almost no roughness. The cross section of the semiconductor substrate Wb is approximately perpendicular to the surfaces F1 and F2.

In order to form the cut part Ca shown in FIG. 7, the dicing width in fragmentation into semiconductor chips 20 is preferably narrower than the slit C.

As described above, in the fifth embodiment, the slit C is formed from the adhesive film 80 side, so as to be deeper than the semiconductor device layer Wa. Thus, the adhesive film 80 is more reliably divided by the slit C. As a result, it is possible to prevent dividing failure and meandering dividing of the adhesive film 80, whereby the adhesive film 80 is more appropriately divided.

In the fifth embodiment, the semiconductor device layer 20a is cut by the slit C.

In a stealth dicing type process, crystals inside the semiconductor wafer W are modified, and the semiconductor wafer W is cleaved at a crack We that extends from the modified part. In this example, the semiconductor device layer Wa in the dicing region Rd is provided with, for example, a device pattern and a wiring pattern, including a test element group (TEG) pad and so on. For this reason, it is difficult for the crack Wc to advance to the top of the surface F1. In such a case, the crack Wc that emerges to the top of the surface F1 may meander in the regions of the pattern. If the crack Wc meanders, the semiconductor chips 20 may not be appropriately divided in expanding with the use of the dicing tape DT. Moreover, when the meandering crack Wc advances to the chip region Rchip shown in FIG. 2, a semiconductor chip 20 may break. In these manners, meandering of the crack Wc of the surface F1 may cause dicing failures.

In view of this, in the fifth embodiment, the semiconductor device layer 20a in which the crack Wc may otherwise meander is removed by the slit C. This prevents the crack Wc from meandering and prevents occurrence of dicing failure.

The other elements of the semiconductor device 1 in the fifth embodiment are similar to the corresponding elements of the semiconductor device 1 in the first embodiment. The semiconductor device 1 in the fifth embodiment provides effects similar to those obtained by the semiconductor device 1 in the first embodiment.

Sixth Embodiment

Figure 9:
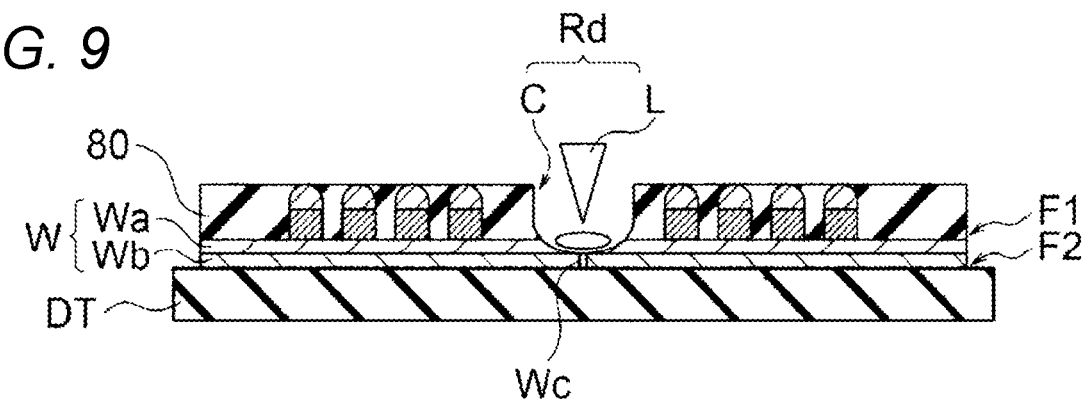
FIG. 9 is a cross-sectional view depicting aspects of a method for manufacturing a semiconductor device according to a sixth embodiment.

FIG. 9 is a cross-sectional view showing a method for manufacturing the semiconductor device 1 according to a sixth embodiment. The sixth embodiment differs from the fifth embodiment in that a slit C is formed by laser ablation, instead of the blade B. In the sixth embodiment, fragmentation into semiconductor chips 20 is performed by a stealth dicing process. Thus, the step in FIG. 9 is performed subsequently to steps similar to those in FIGS. 3A to 3E.

After an adhesive film 80 is attached on the surface F1 of the semiconductor wafer W (refer to FIG. 3E), a slit C for cutting the adhesive film 80 and the semiconductor device layer 20a is formed, as shown in FIG. 9. In more detail, the slit C is formed by laser ablation. That is, the method for forming the slit C may be any method described herein. The step after the step in FIG. 9 may be similar to that in FIG. 8B.

The cross section of the slit C has a surface that includes a melted mark due to heat of laser ablation. On the other hand, the cut surface of the semiconductor substrate Wb is a cleavage surface and is thereby smooth.

The other elements of the semiconductor device 1 in the sixth embodiment are similar to the corresponding elements of the semiconductor device 1 in the fifth embodiment. The semiconductor device 1 in the sixth embodiment provides effects similar to those obtained by the semiconductor device 1 in the fifth embodiment.

Seventh Embodiment

Figure 10A:
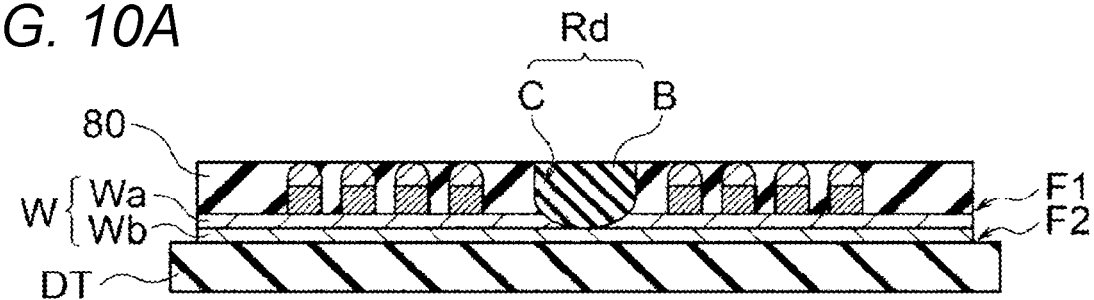
FIGS. 10A-10B are cross-sectional views depicting aspects of a method for manufacturing a semiconductor device according to a seventh embodiment.
Figure 10B:
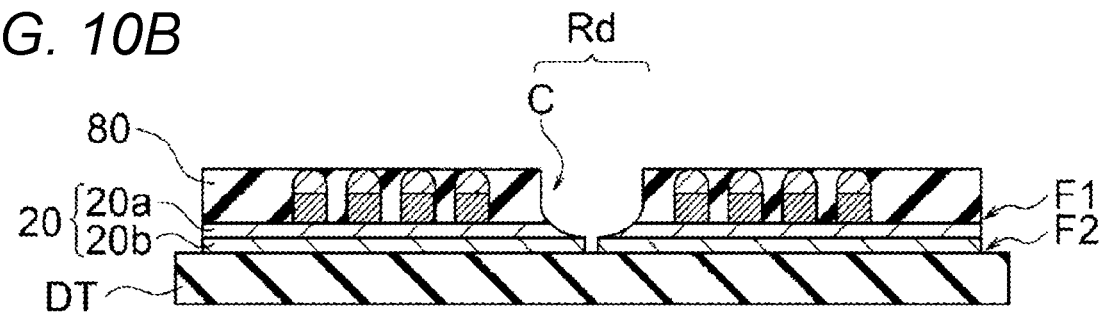

FIGS. 10A and 10B are cross-sectional views showing a method for manufacturing the semiconductor device 1 according to a seventh embodiment. The seventh embodiment differs from the fifth embodiment in that fragmentation into semiconductor chips 20 is performed by a method other than a stealth dicing type process. The steps in FIGS. 10A and 10B are performed subsequently to steps similar to those in FIGS. 3A and 3B and steps similar to those in FIGS. 5A and 5B.

After an adhesive film 80 is attached on the surface F1 of the semiconductor wafer W (refer to FIG. 5B), a slit C for cutting the adhesive film 80 and the semiconductor device layer 20a is formed, as shown in FIG. 10A. In more detail, the slit C is formed by the blade B.

Thereafter, as shown in FIG. 10B, the semiconductor wafer W is fragmented into semiconductor chips 20 along the slit C. Fragmentation is performed by dicing the semiconductor wafer W with, for example, blade dicing, laser ablation, or plasma dicing. That is, the fragmentation method may be any method described herein. In the case of performing fragmentation into semiconductor chips 20 by blade dicing, it is preferable to use a blade having a narrower width than the blade B, which is used in forming the slit C.

The cross section of the slit C has a rough surface due to mechanical cutting with the blade B. On the other hand, the cut surface of the semiconductor substrate Wb varies depending on the dicing method. In plasma dicing, cutting is performed by non-contact chemical etching. For this reason, the cut surface of the semiconductor substrate Wb in plasma dicing is smoother than a cut surface made by blade dicing but is rougher than a cut surface made by a stealth dicing type process.

The other elements of the semiconductor device 1 in the seventh embodiment are similar to the corresponding elements of the semiconductor device 1 in the fifth embodiment. The semiconductor device 1 in the seventh embodiment provides effects similar to those obtained by the semiconductor device 1 in the fifth embodiment.

Eighth Embodiment

Figure 11:
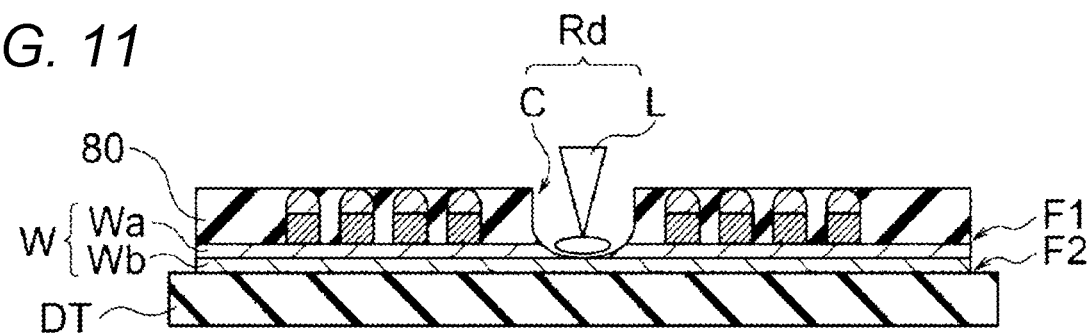
FIG. 11 is a cross-sectional view depicting aspects of a method for manufacturing a semiconductor device according to an eighth embodiment.

FIG. 11 is a cross-sectional view showing a method for manufacturing the semiconductor device 1 according to an eighth embodiment. The eighth embodiment differs from the seventh embodiment in that a slit C is formed by laser ablation, instead of the blade B. In the eighth embodiment, fragmentation into semiconductor chips 20 is performed by a method other than stealth dicing type processes. Thus, the step in FIG. 11 is performed subsequently to steps similar to those in FIGS. 3A and 3B and steps similar to those in FIGS. 5A and 5B. The eighth embodiment is a combination of the sixth and the seventh embodiments.

After an adhesive film 80 is attached on the surface F1 of the semiconductor wafer W (refer to FIG. 5B), a slit C for cutting the adhesive film 80 and the semiconductor device layer 20a is formed, as shown in FIG. 11. In more detail, the slit C is formed by laser ablation. That is, the method for forming the slit C may be any method described herein. The step after the step in FIG. 11 may be similar to that in FIG. 10B.

The other elements of the semiconductor device 1 in the eighth embodiment are similar to the corresponding elements of the semiconductor device 1 in the seventh embodiment. The semiconductor device 1 in the eighth embodiment provides effects similar to those obtained by the semiconductor device 1 in the seventh embodiment.

Ninth Embodiment

Figure 12A:
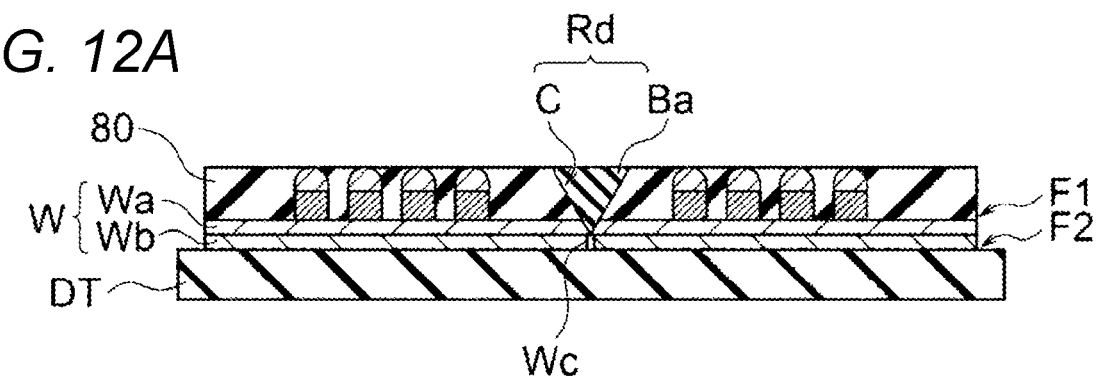
FIGS. 12A and 12B are cross-sectional views depicting aspects of a method for manufacturing a semiconductor device according to a ninth embodiment.
Figure 12B:
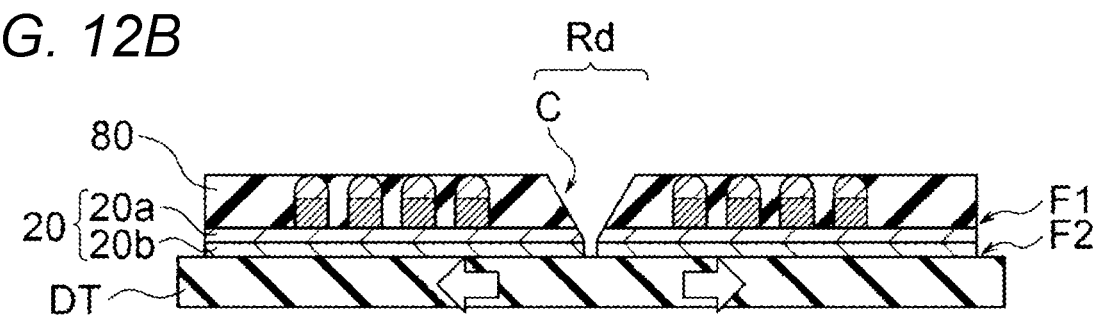

FIGS. 12A and 12B are cross-sectional views showing a method for manufacturing the semiconductor device 1 according to a ninth embodiment. The ninth embodiment differs from the fifth embodiment in that the blade B for forming a slit C has a V-shaped tip. In the ninth embodiment, fragmentation into semiconductor chips 20 is performed by a stealth dicing type process. Thus, the steps in FIGS. 12A and 12B are performed subsequently to steps similar to those in FIGS. 3A to 3E.

After an adhesive film 80 is attached on the surface F1 of the semiconductor wafer W (refer to FIG. 3E), a slit C for cutting the adhesive film 80 and the semiconductor device layer 20a is formed, as shown in FIG. 12A. In more detail, the slit C is formed by a blade Ba having a V-shaped tip. In such a case, the cut part surface CF shown in FIG. 7 has a shape tilting relative to the side surface Fs.

Thereafter, as shown in FIG. 12B, the semiconductor wafer W is fragmented into semiconductor chips 20 along the slit C. The step in FIG. 12B is performed in a manner approximately similar to the step in FIG. 8B.

In this manner, the tip shape of the blade B is not limited to an approximately round shape and may have another shape. Fragmentation into semiconductor chips 20 shown in FIG. 12B may be performed by blade dicing. In such a case, the cut part surface CF has the same surface roughness as the side surface Fs but has a different shape from the side surface Fs, as shown in FIGS. 7 and 12B.

The other elements of the semiconductor device 1 in the ninth embodiment are similar to the corresponding elements of the semiconductor device 1 in the fifth embodiment. The semiconductor device 1 in the ninth embodiment provides effects similar to those obtained by the semiconductor device 1 in the fifth embodiment.

Modification Example

FIGS. 13A to 13G are cross-sectional views showing a method for manufacturing the semiconductor device 1 according to a modified embodiment. The modification example differs from the fifth embodiment in that a cut part Ca, as shown in FIG. 7, is formed by laser grooving.

In the modification example, the cut part Ca is formed by laser grooving, and therefore, the slit C may reach the semiconductor wafer W as in the fifth embodiment or may not reach the semiconductor wafer W as in the first embodiment. The following describes additional steps of laser grooving to the process in the first embodiment. Thus, the steps in FIGS. 13A to 13G are performed subsequently to a step similar to that in FIG. 3A.

Figure 13A:
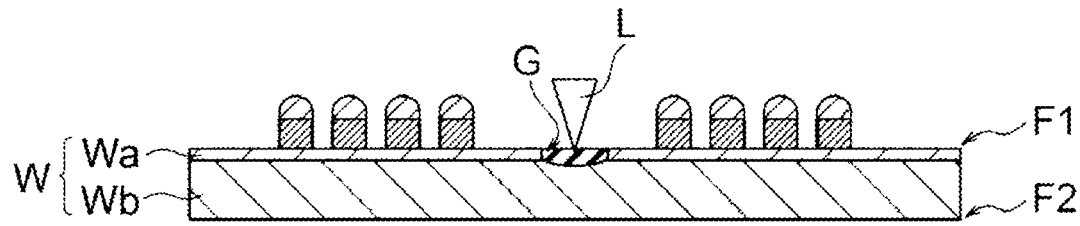
FIGS. 13A-13G are cross-sectional views depicting aspects of a method for manufacturing a semiconductor device according to a modified embodiment.
Figure 13B:
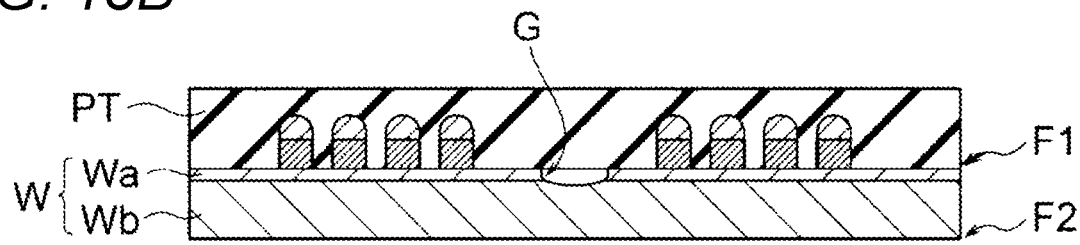
Figure 13C:
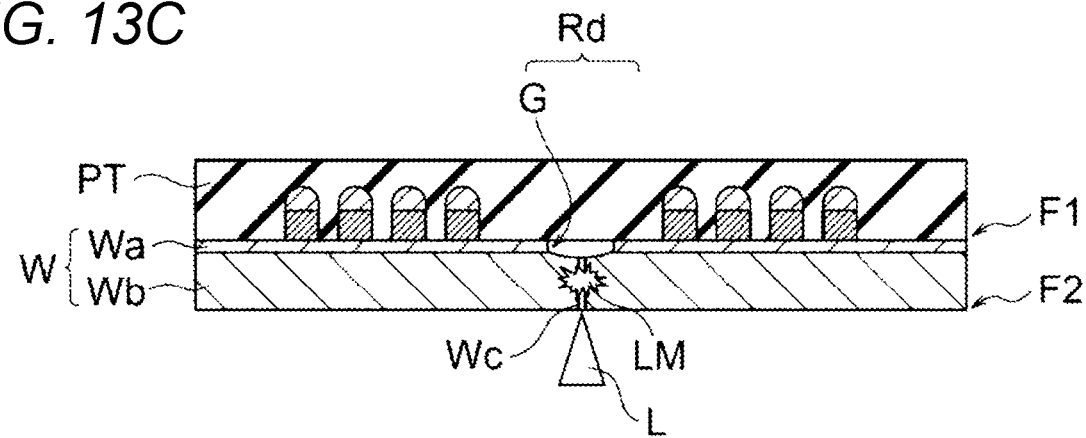
Figure 13D:
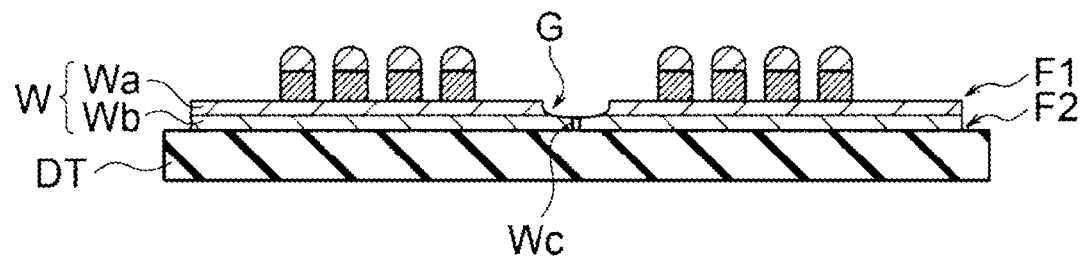
Figure 13E:
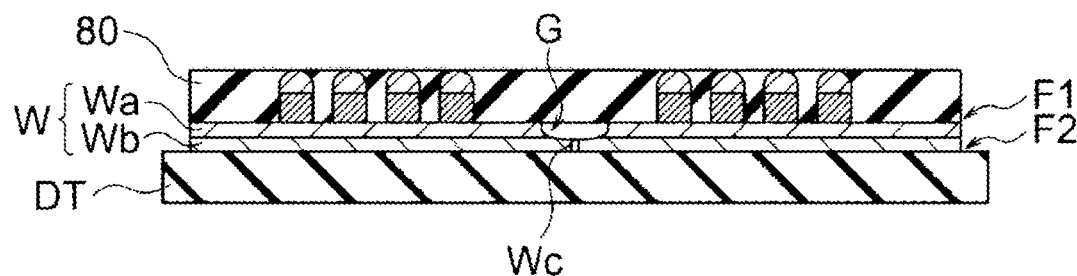
Figure 13F:
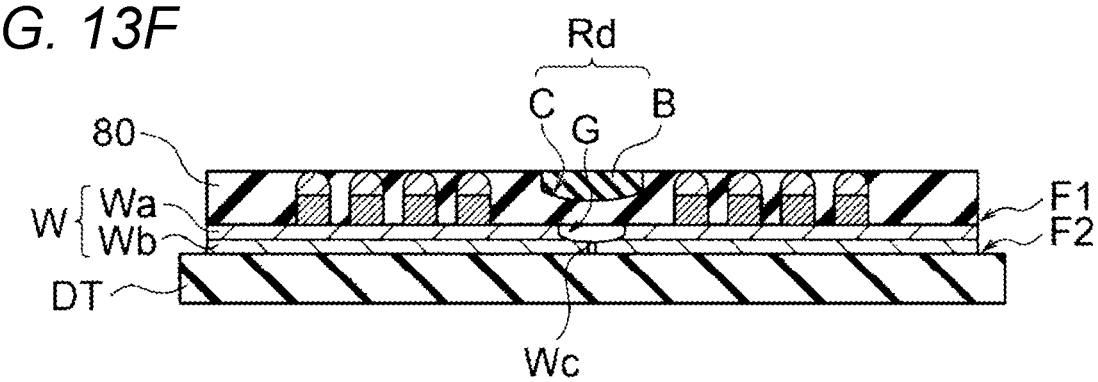
Figure 13G:
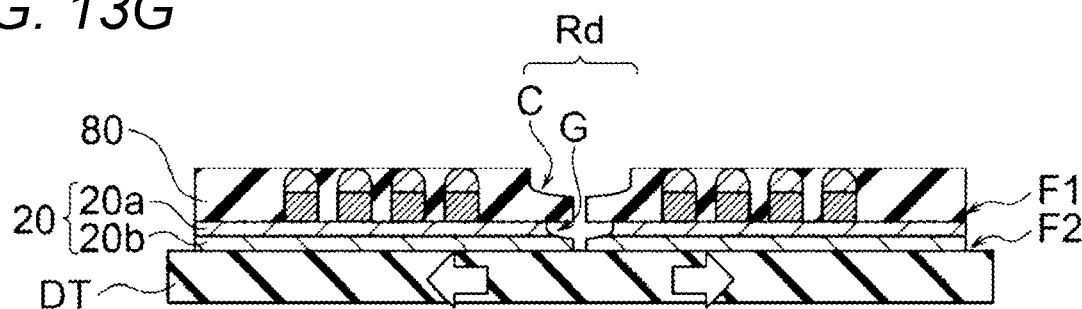

After a semiconductor device layer Wa and an electrode pillar 21 are formed on the surface F1 of the semiconductor wafer W (refer to FIG. 3A), a groove G is formed by laser light L, so as to expose the semiconductor substrate Wb from the semiconductor device layer Wa, as shown in FIG. 13A. That is, before an adhesive film 80 is provided on the semiconductor wafer W, a groove G is formed from the surface F1 side of the wafer W, along the dicing region Rd, in such a manner as to be deeper than the semiconductor device layer Wa but be shallower than the surface F2 of the semiconductor wafer W.

The groove G cuts the semiconductor device layer Wa that is difficult to cut, before the slit C is formed. Thus, the groove G functions approximately similarly to the slit C that cuts the semiconductor device layer Wa shown in FIG. 8A in the fifth embodiment. From this point of view, a part of the groove G corresponds to the cut part Ca shown in FIG. 7.

The steps in FIGS. 13B to 13G are performed in a manner approximately similar to the steps in FIGS. 3B to 3G. In the example shown in FIG. 13F, the slit C does not reach the semiconductor wafer W, but the groove G is formed in such a manner as to remove the semiconductor device layer Wa.

The method for forming the groove G is not limited to laser grooving and may be any other method.

The other elements of the semiconductor device 1 in the modification example are similar to the corresponding elements of the semiconductor device 1 in the fifth embodiment. The semiconductor device 1 in the modification example provides effects similar to those obtained by the semiconductor device 1 in the fifth embodiment. The semiconductor device 1 in the modification example may be combined with the first to the fourth embodiments and the sixth to the ninth embodiments. That is, the slit C may not reach the semiconductor wafer W or may reach the semiconductor wafer W. In addition, the method for forming the slit C and the method for performing fragmentation into semiconductor chips 20 may be any methods described herein.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:
   providing an adhesive film over a first surface of a semiconductor wafer on which a semiconductor device layer and a bump electrically connected to the semiconductor device layer are formed;
   forming a slit in the adhesive film, wherein the slit reaches the semiconductor device layer;
   fragmenting the semiconductor wafer into semiconductor chips along the slit; and
   connecting the bump to a wiring of a circuit board.

2. The method according to claim 1, further comprising:
   before providing the adhesive film, emitting laser light towards a region in a second surface of the semiconductor wafer corresponding to a region of the adhesive film where the slit is to be formed.

3. The method according to claim 2, wherein
   a crystal property of an internal portion of the semiconductor wafer is modified by the laser light, and
   the fragmenting includes cleaving the semiconductor wafer at a modified region including the internal portion of the semiconductor wafer where the crystal property was modified.

4. The method according to claim 3, further comprising:
   after emitting the laser light but before providing the adhesive film, inspecting a condition of a crack that extends from the modified region towards the first or the second surface.

5. The method according to claim 1, wherein the forming of the slit further includes contacting a blade to the adhesive film or emitting laser light to the adhesive film.

6. The method according to claim 1, wherein the semiconductor wafer is fragmented by blade dicing, laser ablation, or plasma dicing.

7. The method according to claim 1, wherein the fragmenting includes dividing the adhesive film along the slit.

8. The method according to claim 1, wherein a cut surface of the fragmented semiconductor wafer has a different shape or a different surface state from a side surface of the adhesive film.

9. The method according to claim 8, wherein the cut surface of the semiconductor wafer is substantially vertical to the first surface of the semiconductor wafer, and the side surface of the adhesive film is inclined with respect to the cut surface.

10. The method according to claim 8, wherein the forming includes applying a blade having a V-shape to the adhesive film.

11. The method according to claim 1, wherein a thickness of the semiconductor wafer is less than or equal to a thickness of the adhesive film.

12. A method for manufacturing a semiconductor device, comprising:
    providing an adhesive film over a first surface of a semiconductor wafer on which a semiconductor device layer and a bump electrically connected to the semiconductor device layer are formed;
    forming a slit in the adhesive film;
    fragmenting the semiconductor wafer into semiconductor chips along the slit; and
    connecting the bump to a wiring of a circuit board, wherein
    the method further comprises, before providing the adhesive film, forming a groove in the semiconductor device layer at a position where the slit is to be formed.

13. The method according to claim 12, wherein the groove is formed by laser grooving.

14. The method according to claim 12, wherein the slit does not reach the semiconductor wafer.

15. The method according to claim 14, wherein the slit has a depth that is at least one-third of a thickness of the adhesive film.

16. The method according to claim 12, wherein the forming of the slit further includes contacting a blade to the adhesive film or emitting laser light to the adhesive film.

17. The method according to claim 12, wherein a thickness of the semiconductor wafer is less than or equal to a thickness of the adhesive film.

18. A semiconductor device, comprising:
- a circuit board;
- a semiconductor chip having a first surface on which a semiconductor device layer and a bump electrically connected to the semiconductor device layer are formed, and a second surface that faces the first surface, the semiconductor chip being coupled to the circuit board via the bump; and
- an adhesive film covering the bump between the semiconductor chip and the circuit board, wherein
- the semiconductor chip includes a first cut surface that is connected to both the first surface and one of side surfaces of the semiconductor chip between the first and second surfaces, and
- the adhesive film is in contact with the first cut surface of the semiconductor chip.

19. The semiconductor device according to claim 18, wherein the first cut surface has a different shape or a different surface state from said one of side surfaces.

20. The semiconductor device according to claim 18, wherein the semiconductor chip further includes a second cut surface that is connected to both the first surface and another side surface that faces said one of side surfaces.

\* \* \* \* \*